(12) United States Patent
Lee et al.

(10) Patent No.: US 7,642,200 B2
(45) Date of Patent: Jan. 5, 2010

(54) METHODS OF FORMING A THIN FILM AND METHODS OF MANUFACTURING A CAPACITOR AND A GATE STRUCTURE USING THE SAME

(75) Inventors: Jung-Ho Lee, Suwon-si (KR); Jun-Hyun Cho, Suwon-si (KR); Jung-Sik Choi, Dongdaemun-gu (KR); Sang-Mun Chon, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 357 days.

(21) Appl. No.: 11/331,744

(22) Filed: Jan. 13, 2006

(65) Prior Publication Data
US 2006/0166512 A1    Jul. 27, 2006

(30) Foreign Application Priority Data
Jan. 24, 2005    (KR)    ........................ 10-2005-0006173

(51) Int. Cl.
*H01L 21/31* (2006.01)
*H01L 21/336* (2006.01)

(52) U.S. Cl. ............... 438/785; 438/216; 438/240; 438/261; 438/287

(58) Field of Classification Search ............... 438/785
See application file for complete search history.

(56) References Cited

U.S. PATENT DOCUMENTS 6,238,734 B1    5/2001    Senzaki et al. .............. 427/226
7,067,439 B2*   6/2006    Metzner et al. ............. 438/785
2005/0008781 A1* 1/2005  Jones ....................... 427/255.31
2007/0037412 A1* 2/2007  Dip et al. ................... 438/785

FOREIGN PATENT DOCUMENTS

| KR | 10-2003-0000423 A | 1/2003 |
| KR | 10-2003-0079181   | 10/2003 |
| KR | 10-2003-0092600 A | 12/2003 |
| KR | 10-2004-0016155   | 2/2004 |

* cited by examiner

*Primary Examiner*—Lex Malsawma
(74) *Attorney, Agent, or Firm*—F. Chau & Associates, LLC

(57) ABSTRACT

A method of forming a thin film is provided. The method includes introducing an organometallic compound represented by the following formula onto a substrate;

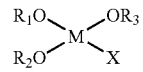

wherein M represents a metal in listed in Group 4A of the periodic table of elements, $R_1$, $R_2$ and $R_3$ independently represent hydrogen or an alkyl group having a carbon number from 1 to 5, and X represents hydrogen or an alkyl group having a carbon number from 1 to 5 and then chemisorbing a portion of the organometallic compound on the substrate. The method further includes removing a non-chemisorbed portion of the organometallic compound from the substrate, providing an oxidizing agent onto the substrate and forming a thin film including a metal oxide on the substrate by chemically reacting the oxidizing agent with a metal in the organometallic compound and by separating ligands of the organometallic compound.

25 Claims, 7 Drawing Sheets

METHODS OF FORMING A THIN FILM AND METHODS OF MANUFACTURING A CAPACITOR AND A GATE STRUCTURE USING THE SAME

CROSS-REFERENCE TO RELATED APPLICATION

This application claims priority under 35 USC § 119 to Korean Patent Application No. 2005-6173 filed on Jan. 24, 2005, the contents of which are incorporated by reference herein in their entirety.

BACKGROUND OF THE INVENTION

1. Field of the Invention

Example embodiments of the present invention relate to methods of forming a thin film. More particularly, example embodiments of the present invention relate to methods of forming a thin film having improved electrical characteristics, including a high dielectric constant through use of an atomic layer deposition (ALD) process, and to methods of manufacturing a gate structure, and a capacitor using the same.

2. Description of the Related Art

As semiconductor devices have become more highly integrated, the size of the cell area of these semiconductor devices has been significantly reduced. Thus, forming a capacitor in the cell area of a semiconductor device such as a dynamic random-access memory (DRAM) device, wherein the capacitors have the requisite capacitance for properly operating the semiconductor device has now become more difficult to achieve due to the minute size of the cell area of these semiconductor devices.

Generally, the capacitance (C) of a capacitor is in proportion to the dielectric constant (∈) and the area (A) of the dielectric layer, whereas the capacitance (C) of the capacitor is inversely proportional to the distance (d) between electrodes in accordance with the following equation (1):

$$C = \in \cdot A/d \quad \text{[Equation 1]}$$

When the dielectric layer of the capacitor is formed using silicon oxide or silicon nitride, the lower electrode of the capacitor generally has a cylindrical shape or a fin shape for increasing the capacitance (C) of the capacitor. However, the cylindrical or fin shape of the lower electrode is a relatively complicated shape, which in turn makes it more difficult to manufacture the lower electrodes precisely.

To solve the above-mentioned difficulty, a method of forming a dielectric layer using a high-k material instead of silicon oxide or silicon nitride has been researched. Examples of high-k materials include aluminum oxide ($Al_2O_3$), tantalum oxide ($Ta_2O_5$), niobium oxide ($Nb_2O_5$), zirconium oxide ($ZrO_2$), or titanium oxide ($TiO_2$). The high-k material has a dielectric constant of about 10 to about 114, which is about 2.5 to about 30 times larger than the dielectric constant for silicon dioxide of 3.9.

A thin film such as a dielectric layer is usually formed by deposition processes such as a chemical-vapor deposition (CVD) process, a low-pressure chemical-vapor deposition (LPCVD) process, a plasma-enhanced chemical-vapor deposition (PECVD) process, or a sputtering process.

However, since the above deposition processes are generally performed at a relatively high temperature, thermal damage may occur to a thin film formed by any of these processes. Additionally, a thin film formed by a CVD process may also be formed having an irregular thickness, as well as poor step coverage.

In contrast, an atomic layer deposition (ALD) process is performed at a temperature that is relatively lower than the temperature used in a CVD process. Moreover, a thin film formed by an ALD process is formed having good step coverage. Thus, ALD processes have become the preferred new deposition process for forming a thin film.

For example, ALD processes have recently been used in forming a high-k material layer. The precursor used for forming the high-k material layer in an ALD process should, however, meet certain recommended conditions as set forth below.

First, the precursor should have a high-saturation vapor pressure at a low temperature and also be chemically and thermally stable. Moreover, ligands coordinated to a metal of the precursor should be promptly and clearly separated from the precursor. Additionally, organic ingredients of the precursor should not remain in the high-k material layer after a formation of the high-k material layer. The precursor should have a liquid phase at room temperature and also be nontoxic. Furthermore, the precursor should be deposited at a high rate.

It is noted however that conventional precursors such as alkyl metal, metal alkoxide, metal halide and β-diketonate may not sufficiently meet the above-mentioned recommended conditions for a precursor to be used in an ALD process for forming a thin film. For example, an alkyl metal, such as $Pb(C_2H_5)_4$, is toxic and explosive. Further, since a metal alkoxide is sensitive to moisture, the metal in the metal alkoxide is prone to binding with a hydrogen or hydroxyl group, thereby leading to undesired impurities such as metal hydroxide being contained in a thin film. Moreover, a β-diketonate precursor has a relatively low vapor pressure and is in a solid phase at room temperature, thereby making β-diketonate an undesirable precursor for use in forming a thin film.

Meanwhile, fluorine β-diketonate, which is a more volatile type of precursor than those precursors already mentioned has been researched as well. Examples of fluorine β-diketonate precursors include hexafluoro pentanedionate (HFAC) and heptafluoro dimethyloctanedionate (HFOD). However, fluorine β-diketonate precursors have a poor reactivity relative to reactants so that ligands are not easily removed from metal in fluorine β-diketonate. In addition, fluorine β-diketonate precursors have a high molecular weight, resulting in a low deposition rate.

Accordingly, there is a need for a precursor for use in an ALD process for forming a thin film that provides improved electrical characteristics such as good step coverage, low leakage current, and a high dielectric constant to a semiconductor device. In particular, there is a need for a metal precursor for forming a thin film which may serve as a gate insulation layer of a gate structure or a dielectric layer of a capacitor and wherein the precursor preferably has the following characteristics of being thermally and chemically stable, not sensitive to moisture, the ability to exist in a liquid phase at room temperature, and has a high reactivity relative to reactants.

SUMMARY OF THE INVENTION

According to an example embodiment of the present invention, a method of forming a thin film is provided. In the method of forming the thin film, an organometallic compound represented by the following chemical formula is introduced onto a substrate:

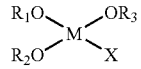

In the above chemical formula, M represents a Group 4A metal, $R_1$, $R_2$ and $R_3$ independently represent hydrogen or an alkyl group having a carbon number from 1 to 5, and X represents hydrogen or an alkyl group having a carbon number from 1 to 5.

A portion of the organometallic compound is chemisorbed on the substrate. A non-chemisorbed portion of the organometallic compound is removed from the substrate. An oxidizing agent is provided onto the substrate. The oxidizing agent is chemically reacted with a metal in the organometallic compound. Ligands of the organometallic compound are separated. Thus, the thin film including metal oxide is formed on the substrate.

According to another example embodiment of the present invention, a method of manufacturing a capacitor is provided. In the method of manufacturing the capacitor, a lower electrode is formed on a substrate. A dielectric layer including metal oxide is formed on the substrate by an atomic layer deposition process using an organometallic compound represented by the following chemical formula:

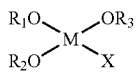

wherein, M represents a Group 4A metal selected from the group consisting of titanium, zirconium and hafnium, $R_1$, $R_2$ and $R_3$ independently represent hydrogen or an alkyl group having a carbon number from 1 to 5, and X represents hydrogen or an alkyl group having a carbon number from 1 to 5. An upper electrode is formed on the dielectric layer.

According to yet another example embodiment of the present invention, a method of manufacturing a gate structure is provided. In the method of manufacturing the gate structure, a gate insulation layer is formed on a substrate by an atomic layer deposition process using an organometallic compound represented by the following chemical formula:

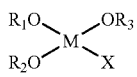

wherein, M represents a Group 4A metal selected from the group consisting of titanium, zirconium and hafnium. $R_1$, $R_2$ and $R_3$ independently represent hydrogen or an alkyl group having a carbon number from 1 to 5, and X represents hydrogen or an alkyl group having a carbon number from 1 to 5. A gate conductive layer is formed on the gate insulation layer. The gate conductive layer and the gate insulation layer are patterned to form a gate pattern including a gate conductive layer pattern and a gate insulation layer pattern.

DESCRIPTION OF THE EXAMPLE EMBODIMENTS OF THE INVENTION

Figure 1:
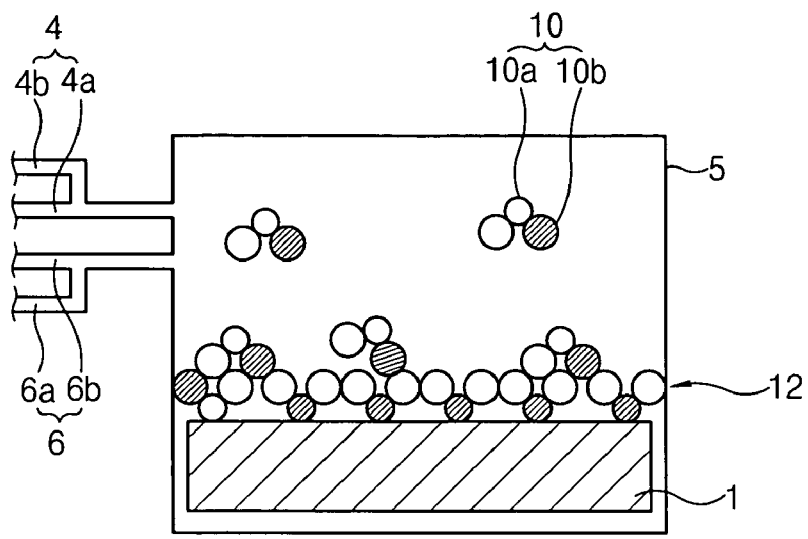
FIGS. 1 to 4 are cross sectional views illustrating a method of forming a thin film by an atomic layer deposition (ALD) process in accordance with an example embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Method of Forming a Thin Film

FIGS. 1 to 4 are cross sectional views illustrating a method of forming a thin film by an atomic layer deposition (ALD) process in accordance with an example embodiment of the present invention. FIG. 5 is a timing sheet illustrating feeding times of reactants for forming a thin film in accordance with an example embodiment of the present invention.

Referring to FIG. 1, after a substrate 1 is loaded into a chamber 5 having a temperature of about 150° C. to about 350° C., an organometallic compound 10 is provided onto the substrate 1. The substrate 1 includes a silicon wafer or a silicon-on-insulator (SOI) substrate. The organometallic compound 10 is represented by the following chemical formula:

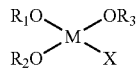

The organometallic compound 10 having the above chemical formula is used as a metal precursor in the ALD process for forming the thin film. In the above chemical formula, M represents a central atom including a Group 4A metal including but not limited to titanium (Ti), zirconium (Zr), hafnium (Hf), etc. Group 4A as denoted herein refers to Group 4A of the periodic table of elements. $OR_1$, $OR_2$ and $OR_3$ independently represent alkoxides, which are first ligands coordinated to the central atom M, respectively. $R_1$, $R_2$ and $R_3$ may be the same as or different from one another. In addition, $R_1$, $R_2$ and $R_3$ independently indicate hydrogen or an alkyl group having a carbon number from 1 to 5. X represents a second ligand coordinated to the central atom M. X represents hydrogen or an alkyl group having a carbon number from 1 to 5. Examples of X include but are not limited to hydrogen, methyl, ethyl, propyl, butyl.

In this example embodiment of the invention, the organometallic compound 10 is titanium methyl tri-tert-butoxide [Ti(OtBu)$_3$Me].

The organometallic compound of this example embodiment, i.e., Ti(OtBu)$_3$Me, which has an alkoxide group and an alkyl group as ligands is a thermally and chemically stable compound. Additionally, Ti(OtBu)$_3$Me is vaporized at a temperature of about 100° C. to about 180° C. Therefore, Ti(OtBu)$_3$Me has good characteristics for use as a metal precursor used in the formation of the thin film by the ALD process.

The chamber 5 may have a temperature of about 100° C. to about 350° C. For instance, when the chamber 5 has a temperature of less than about 100° C., the organometallic compound 10 does not have a vapor phase. When the chamber 5 has a temperature of more than about 350° C., the organometallic compound 10 is substantially decomposed so that the thin film does not form on the substrate 1.

In addition, a first gas supply line 4 and a second gas supply line 6 are connected to the chamber 5 so as to provide source gases onto the substrate 1. The first gas supply line 4 includes a first divided line 4a and a second divided line 4b. The first divided line 4a provides the organometallic compound 10 onto the substrate 1. The second divided line 4b provides first inactive gases into the chamber 5. The first inactive gases purge a portion of the organometallic compound 10 physisorbed on the substrate 1 or drifted in the chamber 5. Additionally, the first inactive gases also prevent the reactants from flowing backward into the first gas supply line 4.

The second gas supply line 6 includes a third divided line 6a and a fourth divided line 6b. The third divided line 6a provides an oxidizing agent 20 into the chamber 5 in the ALD process. Moreover, the fourth divided line 6b provides second inactive gases into the chamber 5. The second inactive gases purge an unreacted oxidizing agent 20 from the chamber 5 and also prevent the reactants from flowing backward into the second gas supply line 6.

Some of the first and the second inactive gases are referred to as purging inactive gases for purging the chamber 5. Others of the first and the second inactive gases are referred to as backflow preventing inactive gases for preventing the reactants from flowing backward into the first gas supply line 4 and/or into the second gas supply line 6.

Further, in this example embodiment of the invention, the organometallic compound 10 represented by the above chemical formula is introduced into the chamber 5 through the first divided line 4a. The organometallic compound 10 is carried using an inactive carrier gas. The organometallic compound 10 is introduced into the chamber 5 for about 0.1 second to about 3.0 seconds by a flow rate of about 50 sccm to about 1,000 sccm. When the organometallic compound 10 includes titanium as a central atom 10a, the organometallic compound 10 is quickly chemisorbed on the substrate 1 in comparison to an organometallic compound including hafnium as a central atom. Thus, the organometallic compound 10 including titanium is introduced into the chamber 5 for about 0.1 second at the flow rate of about 50 sccm to about 300 sccm. The organometallic compound 10 has a temperature of about 30° C. to about 100° C. outside of the chamber 5, such as in a canister. The organometallic compound 10 is in a liquid phase in the canister, whereas the organometallic compound 10 is in a vapor phase in the chamber 5.

When the organometallic compound 10 is provided onto the substrate 1, the central atom 10a of the organometallic compound 10 is chemisorbed onto the substrate 1. That is, a portion of the organometallic compound 10 is chemisorbed onto the substrate 1. Thus, an absorption layer 12 including the organometallic compound 10 is formed on the substrate 1. A portion of the organometallic compound 10 that is not chemisorbed on the substrate 1 is loosely physisorbed on the absorption layer 12 or is drifted in the chamber 5. In addition, the organometallic compound 10 chemisorbed on the substrate 1 is partially decomposed by heat in the chamber 5. Hence, the central atom 10a is chemisorbed on the substrate 1, and the first and second ligands 10b are partially separated from the central atom 10a.

While introducing the organometallic compound 10 into the chamber 5 through the first divided line 4a, a second backflow preventing inactive gas is introduced into the chamber 5 through the fourth divided line 6b so as to prevent the organometallic compound 10 from flowing backward into the second gas supply line 6 as shown in a period S10 of FIG. 5.

Figure 2:
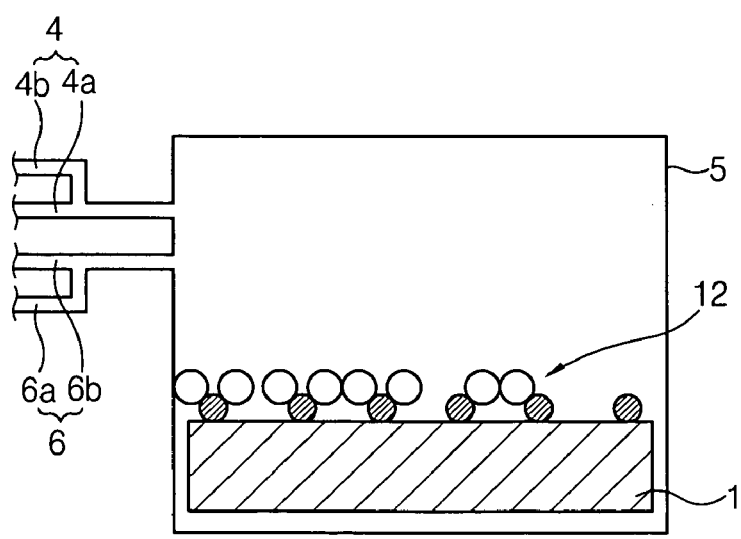

Referring to FIG. 2, a first purging inactive gas is introduced into the chamber 5 through the second divided line 4b to purge the physisorbed and/or drifted portion of the organometallic compound 10 and the ligands 10b separated from the central atom 10a. The first purging inactive gas includes argon (Ar) gas or nitrogen ($N_2$) gas. Further, in this example embodiment of the invention, the first purging inactive gas is introduced into the chamber 5 for about 0.5 seconds to about 20 seconds, and preferably for about one second to about three seconds. Additionally, the first purging inactive gas is introduced into the chamber 5 at a flow rate of about 50 sccm to about 400 sccm.

A non-chemisorbed portion of the organometallic compound 10 and the ligands 10b separated from the central atom 10a are removed from the chamber 5 by the above-described purge process. As a result, the absorption layer 12 including the organometallic compound 10 remains on the substrate 1.

As shown in a period S12 of FIG. 5, the second backflow preventing inactive gas is provided into the chamber 5 through the fourth divided line 6b while introducing the first purging inactive gas into the chamber 5 through the second divided line 4b in the purge process. The second backflow preventing inactive gas prevents the non-chemisorbed portion of the organometallic compound 10 and the ligands 10b separated from the central atom 10a from flowing backward into the second gas supply line 6.

Figure 3:
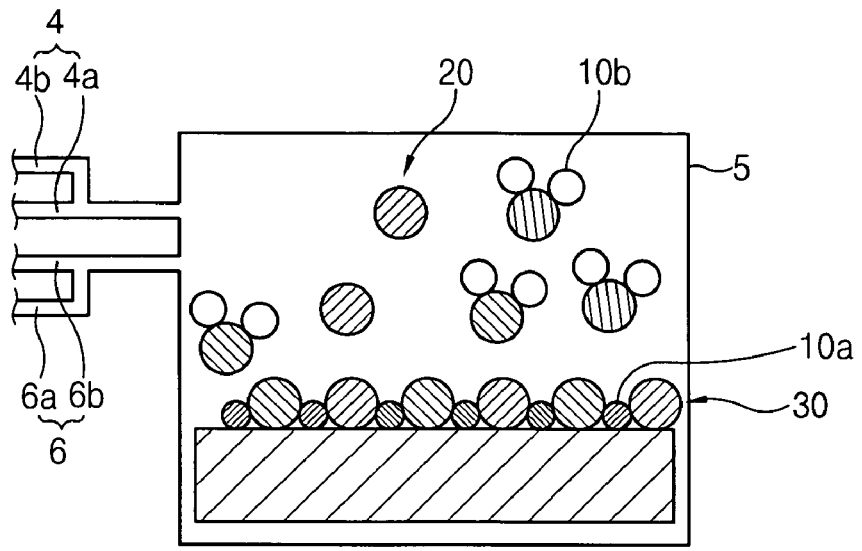

Referring to FIG. 3, an oxidizing agent 20 is introduced into the chamber 5 through the third divided line 6a. The oxidizing agent 20 is chemically reacted with the central atom 10a of the organometallic compound 10 to thereby form a metal oxide. The oxidizing agent 20 is provided onto the adsorption layer 12 for about two seconds to about five seconds by a flow rate of about 50 sccm to about 1,000 sccm. Examples of the oxidizing agent 20 of the example embodiments of the present invention include but are not limited to ozone ($O_3$), water vapor ($H_2O$), hydrogen peroxide ($H_2O_2$), methanol ($CH_3OH$), ethanol ($C_2H_5OH$), plasma $O_2$, remote plasma $O_2$, plasma $N_2O$, or mixtures thereof. When the oxidizing agent 20 includes ozone, contents of impurities in the thin film are relatively small and the oxidizing agent 20 is easily controlled, thereby making the oxidizing agent 20 which includes ozone desirable for oxidizing the chemisorbed organometallic compound 10. In addition, in this example embodiment, ozone is obtained using an ozonizer that is an ozone generator. When oxygen ($O_2$) gas is treated using the ozonizer, the oxygen gas is partially transformed into ozone.

The reactivity between the central atom 10a in the organometallic compound 10 and the oxidizing agent 20 is very high. As the central atom 10a in the organometallic compound 10 is chemically reacted with the oxidizing agent 20, the first and the second ligands 10b coordinated to the central atom 10a are separated promptly. As a result, a metal oxide atomic layer 30 is formed on the substrate 1.

As shown in a period S14 of FIG. 5, a first backflow preventing inactive gas is introduced into the chamber 5 through the second divided line 4b. The first backflow preventing inactive gas prevents the oxidizing agent 20 from flowing backward into the first gas supply line 4.

Figure 4:
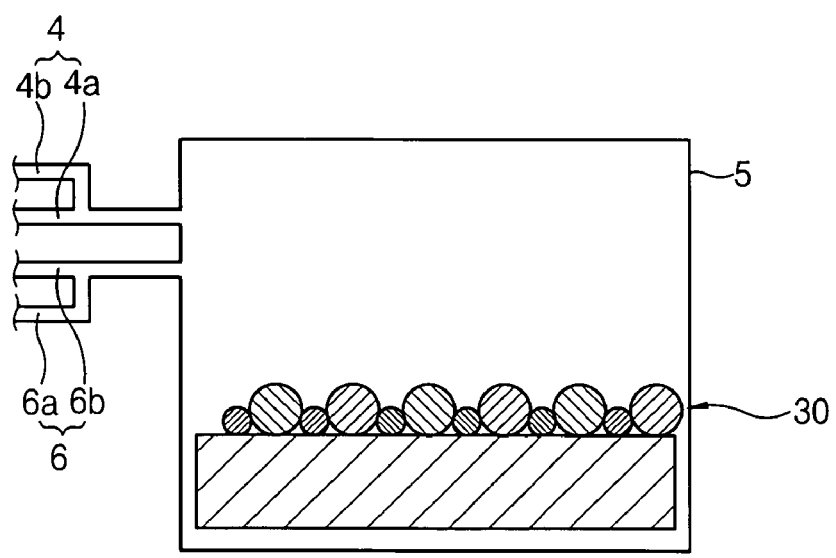
Figure 5:
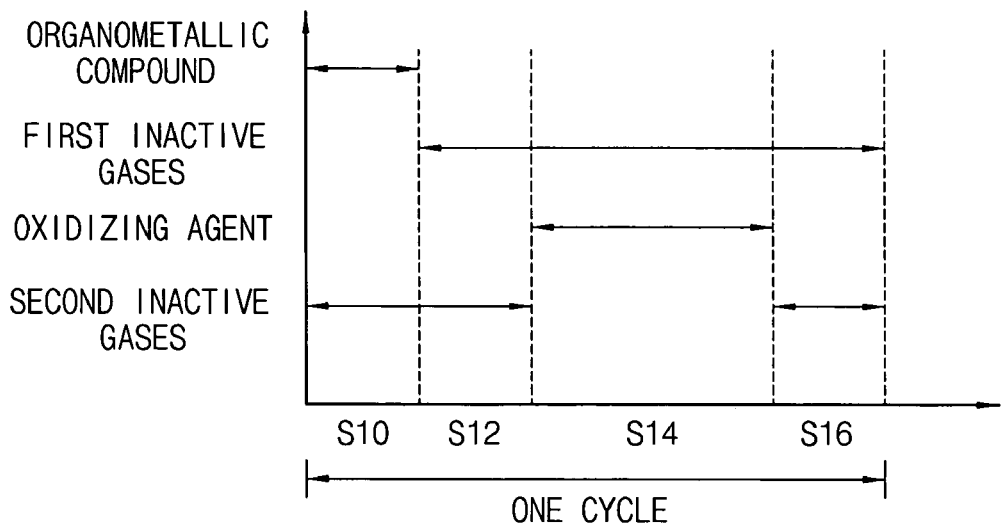
FIG. 5 is a timing sheet illustrating feeding times of reactants for forming a thin film in accordance with an example embodiment of the present invention.

Referring to FIG. 4, a second purging inactive gas is introduced into the chamber 5 through the fourth divided line 6b. The second purging inactive gas purges an unreacted oxidizing agent 20 and the separated first and second ligands 10b from the chamber 5. The purge process is performed for about one second to about twenty seconds and preferably for about one second to about four seconds. In addition, the second purging inactive gas is provided into the chamber 5 at a flow rate of about 50 sccm to about 400 sccm.

As shown in a period S16 of FIG. 5, while the second purging inactive gas is introduced through the fourth divided line 6b, the first backflow preventing inactive gas is introduced into the chamber 5 through the second divided line 4b. The first backflow preventing inactive gas prevents the unreacted oxidizing agent 20 and the first and second ligands 10b from flowing backward into the first gas supply line 4.

The above-described steps of introducing the organometallic compound 10, purging the non-chemisorbed portion of the organometallic compound 10, introducing the oxidizing agent 20, and purging the oxidizing agent 20 are repeatedly carried out at least once. As a result, the thin film having a desired thickness is formed on the substrate 1.

Method of Forming a Thin Film Including Titanium Oxide

Referring to FIGS. 1 to 4, after a substrate 1 such as a silicon wafer is loaded into a chamber 5, the chamber 5 is substantially vacuumized. The chamber 5 has a temperature of about 100° C. to about 350° C. For example, in this example embodiment, the chamber 5 has a temperature of about 300° C.

A Ti(OtBu)$_3$Me metal precursor is provided onto the substrate 1. The Ti(OtBu)$_3$Me metal precursor is provided at a flow rate of about 100 sccm for about 0.1 second to about 3 seconds. The metal precursor is introduced into the chamber 5 together with a carrier gas such as argon (Ar) gas or nitrogen ($N_2$) gas.

Before the Ti(OtBu)$_3$Me metal precursor is introduced into the chamber 5, the metal precursor is at a temperature of about 40° C. to about 120° C. For example, in this example embodiment, the Ti(OtBu)$_3$Me metal precursor is at a temperature of about 40° C. outside of the chamber 5. Also, the Ti(OtBu)$_3$Me metal precursor is in a liquid phase.

While introducing the Ti(OtBu)$_3$Me metal precursor into the chamber 5, a second backflow preventing inactive gas is introduced into the chamber 5 through the second gas supply line 6. The second backflow preventing inactive gas prevents the Ti(OtBu)$_3$Me metal precursor from flowing backward into the second gas supply line 6.

The Ti(OtBu)$_3$Me metal precursor is partially chemisorbed on the substrate 1. In particular, titanium (Ti) of a central atom in Ti(OtBu)$_3$Me is chemically bonded with the substrate 1. Besides a portion of Ti(OtBu)$_3$Me being chemisorbed on the substrate 1, a portion of Ti(OtBu)$_3$Me is physisorbed with each other. Moreover, the bonding energy between the physisorbed Ti(OtBu)$_3$Me is very weak.

A portion of the chemisorbed Ti(OtBu)$_3$Me is thermally decomposed so that ligands such as a tri-tertiary butoxy group and a methyl group are separated from titanium. Since titanium is chemisorbed on the substrate 1, only the tri-tertiary butoxy group and the methyl group in Ti(OtBu)$_3$Me are partially separated from the substrate 1.

A first purging inactive gas such as an argon gas and a nitrogen gas are introduced into the chamber 5 through a first gas supply line 4. The purge process is carried out for about one second to about twenty seconds. For example, in this example embodiment, the purge process is carried out for about one second to about four seconds. After the purge process, the non-chemisorbed portion of Ti(OtBu)$_3$Me and the tri-tertiary butoxy group and the methyl group separated from Ti(OtBu)$_3$Me are removed from the chamber 5. Thus, the chemisorbed portion of Ti(OtBu)$_3$Me or a titanium film remains only on the substrate 1. In the purge process, a second backflow preventing inactive gas is introduced into the chamber 5 through the second gas supply line 6. The second backflow preventing inactive gas prevents the non-chemisorbed portion of Ti(OtBu)$_3$Me and separated ligands from flowing backward into the second gas supply line 6.

An oxidizing agent including ozone is introduced into the chamber 5 through the second gas supply line 6. The oxidizing agent is chemically reacted with the central atom in Ti(OtBu)$_3$Meso that a titanium oxide film is formed on the substrate 1. The tri-tertiary butoxy group and the methyl group, which are ligands of Ti(OtBu)$_3$Me, bind with the oxidizing agent. Thus, the tri-tertiary butoxy group and the methyl group are separated from the central atom through a ligand exchange reaction.

While introducing the oxidizing agent including ozone into the chamber 5, the first backflow preventing inactive gas is provided into the chamber 5 through the first gas supply line 4 so as to prevent the oxidizing agent from flowing backward into the first gas supply line 4.

A second purging inactive gas such as an argon gas and a nitrogen gas are introduced into the chamber 5 through the second gas supply line 6. Thus, an unreacted oxidizing agent and the separated the tri-tertiary butoxy group and the methyl group are removed from the chamber 5.

In this example embodiment, a unit cycle of the ALD process includes introducing Ti(OtBu)$_3$Me, purging the non-chemisorbed Ti(OtBu)$_3$Me, introducing the oxidizing agent and purging the unreacted oxidizing agent. The unit cycle is carried out for about four seconds and about fifteen seconds. After repeatedly performing the unit cycle of the ALD process, the thin film of titanium oxide having a desired thickness is formed on the substrate 1. When a thin film including titanium oxide according to the example embodiments of the present invention is used as a dielectric layer of a capacitor or a gate insulation layer of a gate structure, the electrical characteristics of the capacitor or the gate structure are improved.

Method of Manufacturing a Capacitor

Figure 6:
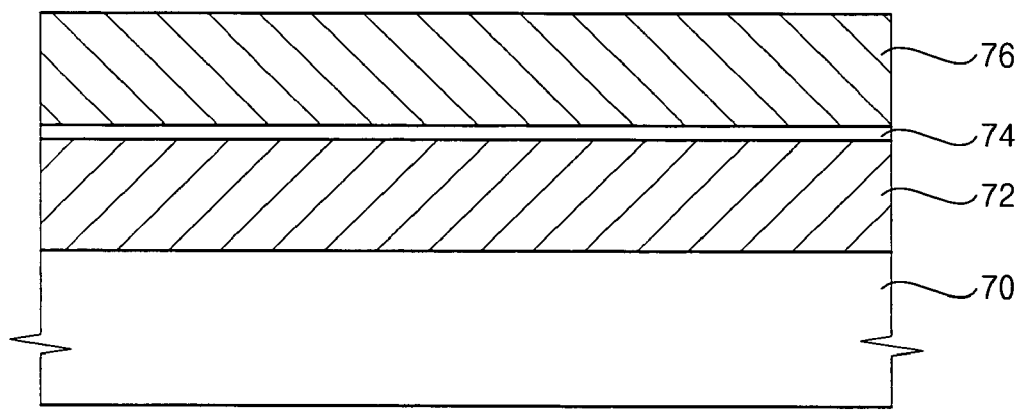
FIG. 6 is a cross sectional view illustrating a method of manufacturing a capacitor in accordance with an example embodiment of the present invention.

FIG. 6 is a cross sectional view illustrating a method of manufacturing a capacitor in accordance with an example embodiment of the present invention.

Referring to FIG. 6, a substrate 70 is provided. The substrate 70 includes a silicon wafer or an SOI substrate. An active region and a field region are defined on the substrate 70 by an isolation process such as a shallow trench isolation (STI) process. When a semiconductor device including the substrate 70 corresponds to a dynamic random access memory (DRAM) device, semiconductor structures such as gate structures, bit lines and the like are formed on the substrate 70.

A lower electrode 72 is formed on the substrate 70 having the semiconductor structures. The lower electrode 72 includes but is not limited to polysilicon, a metal, or a metal nitride. In addition, the lower electrode 72 is formed by a chemical-vapor deposition (CVD) process. In this example embodiment, the lower electrode 72 has a cylindrical shape to enlarge an effective area of the capacitor.

A dielectric layer 74 is formed on the lower electrode 72. The dielectric layer 74 of this example embodiment is formed by an ALD process that is substantially the same as the ALD process described with reference to FIGS. 1 to 4. Additionally, the dielectric layer 74 includes a metal oxide such as titanium oxide.

In the formation of the dielectric layer 74, an organometallic compound is provided onto the substrate 50 having the lower electrode 72 thereon. Moreover, the organometallic compound is partially chemisorbed on the lower electrode 72 whereas a non-chemisorbed portion of the organometallic compound is removed from the substrate 50. An oxidizing agent is provided onto the lower electrode 72 so that a metal in the organometallic compound is chemically reacted with oxygen in the oxidizing agent. Ligands in the organometallic compound are separated from the organometallic compound. A portion of the oxidizing agent that is not reacted with the metal and the separated ligands is removed from the substrate 70.

When, the dielectric layer 74 is formed by the ALD process, Ti(OtBu)$_3$Me is used as the organometallic compound. Ti(OtBu)$_3$Me is desirable for use as a metal precursor in the ALD process because Ti(OtBu)$_3$Me is thermally and chemically stable and is vaporized at a temperature of about 100° C. to about 180° C.

An upper electrode 76 is formed on the dielectric layer 74. The upper electrode 76 includes but is not limited to polysilicon, a metal, or a metal nitride. In addition, the upper electrode 76 is formed by a CVD process.

The upper electrode 76, the dielectric layer 74 and the lower electrode 72 are patterned to form the capacitor on the substrate 70. Here, the dielectric layer 74 is formed by the ALD process using the organometallic compound. The dielectric layer 74 includes titanium oxide. A capacitor formed which includes the dielectric layer 74 of the example embodiments of the present invention has a sufficiently reduced leakage current in comparison to conventional capacitors. Moreover, when a capacitor manufactured in accordance with the example embodiments of the present invention is employed in a semiconductor device having a critical dimension of about 90 nm, the semiconductor device including the capacitor also has improved electrical characteristics as compared to conventional capacitors.

Method of Manufacturing a Gate Structure

Figure 7:
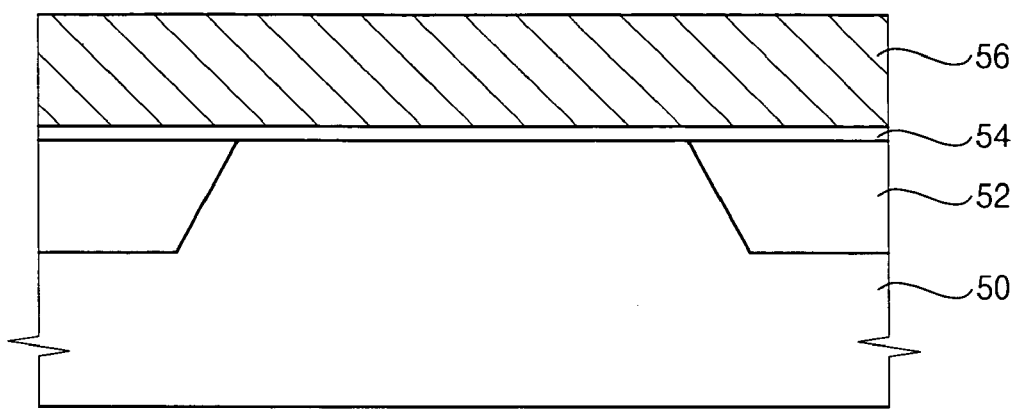
FIGS. 7 and 8 are cross sectional views illustrating a method of manufacturing a gate structure in accordance with an example embodiment of the present invention.
Figure 8:
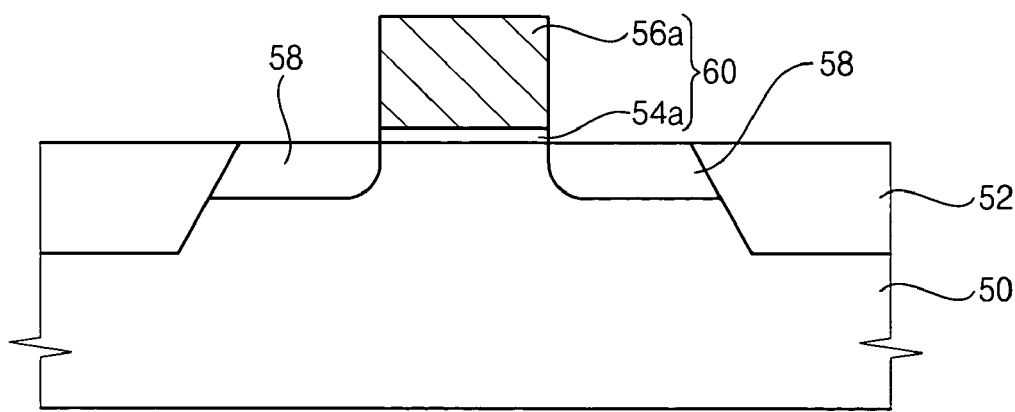

FIGS. 7 and 8 are cross sectional views illustrating method of manufacturing a gate structure in accordance with an example embodiment of the present invention.

Referring to FIG. 7, after a substrate 50 is prepared, a trench isolation layer 52 is formed on the substrate 50 to define an active region and a field region. The substrate 50 includes a silicon wafer or an SOI substrate.

A gate insulation layer 54 is formed on the substrate 50. The gate insulation layer 54 is formed by an ALD process substantially the same as the ALD process described with reference to FIGS. 1 to 4. The gate insulation layer 54 includes a metal oxide such as titanium oxide.

Particularly, an organometallic compound is provided onto the substrate 50. The organometallic compound is partially chemisorbed on the substrate 50. A non-chemisorbed portion of the organometallic compound is removed from the substrate 50. An oxidizing agent is provided onto the substrate 50 having a chemisorbed portion of the organometallic compound. Metal in the organometallic compound is chemically reacted with oxygen in the oxidizing agent. Ligands in the organometallic compound are separated from the organometallic compound. The oxidizing agent that is not reacted with the metal (i.e., an unreacted oxidizing agent) and the separated ligand are removed from the substrate 50.

In this example embodiment, when the gate insulation layer 54 is formed by the ALD process, Ti(OtBu)$_3$Me is used as the organometallic compound. Ti(OtBu)$_3$Me is desirable as a metal precursor in the ALD process for forming the gate insulation layer 54 because, as discussed, Ti(OtBu)$_3$Me is thermally and chemically stable and also Ti(OtBu)$_3$Me is vaporized at a temperature of about 100° C. to about 180° C.

Next, a gate conductive layer 56 is formed on the gate insulation layer 54. The gate conductive layer 56 includes but is not limited to polysilicon, a metal, or a metal nitride. In addition, the gate conductive layer 56 is formed by a CVD process.

Referring to FIG. 8, the gate conductive layer 56 and the gate insulation layer 54 are patterned by a photolithography process to thereby form a gate structure 60 on the substrate 50. The gate structure 60 includes a gate insulation layer pattern 54a and a gate conductive layer pattern 56a.

Source/drain regions 58 are formed at portions of the substrate 50 adjacent to the gate structure 60. The source/drain regions 58 are formed before forming the gate insulation layer 54 or after forming the gate structure 60. After forming the gate structure 60, a gate spacer is formed on a sidewall of the gate structure 60.

The gate insulation layer pattern 54a has a thin equivalent oxide thickness (EOT). In addition, a leakage current between the gate conductive layer pattern 56a and the substrate 50 is sufficiently reduced. Thus, the gate structure 60 has improved electrical characteristics.

Hereinafter, experimental results concerning thin films according to example embodiments of the present invention will be described.

Measurement of an Evaporation Point of Ti(OtBu)$_3$Me

Figure 9:
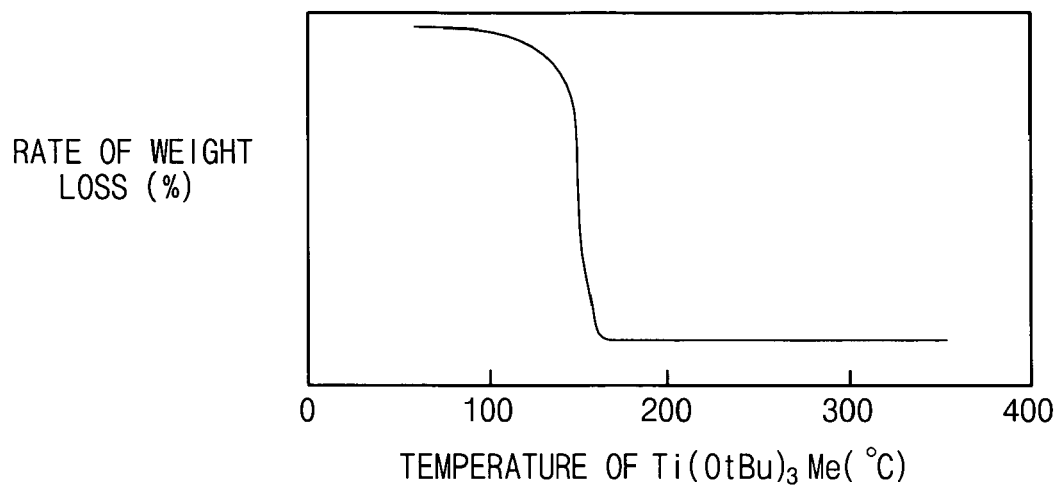
FIG. 9 is a graph illustrating a thermogravimetric analysis (TGA) result of Ti(OtBu)$_3$Me in accordance with an example embodiment of the present invention.

FIG. 9 is a graph illustrating a thermogravimetric analysis (TGA) result of Ti(OtBu)$_3$Me in accordance with an example embodiment of the present invention.

A thermogravimetric analysis means a thermal analysis technique that is used to measure a variation of the weight of a sample relative to the temperature and time used in the analysis of the sample. In a thermogravimetric analysis, as a temperature of the sample is increased by a constant rate or is maintained isothermally, the variation of the weight of the sample due to thermal decomposition, sublimation, evaporation or oxidation with a thermogram is measured.

Referring to FIG. 9, as the temperature of Ti(OtBu)$_3$Me was increased by a rate of about 5° C./minute up to a temperature of about 300° C., a weight loss of Ti(OtBu)$_3$Me was measured. As a result, the weight of Ti(OtBu)$_3$Me was rapidly reduced at a temperature of about 100° C. to about 180° C. This sudden weight loss of Ti(OtBu)$_3$Me is caused by an evaporation of Ti(OtBu)$_3$Me. As the thermogravimetric analysis illustrated in FIG. 9, the evaporation point of Ti(OtBu)$_3$Me is about 100° C. to about 180° C. Therefore, Ti(OtBu)$_3$Me has a proper evaporation point which is suitable for it being used as a metal precursor in an ALD process.

Characteristics of Thin Films According to Various Deposition Conditions

Figure 10:
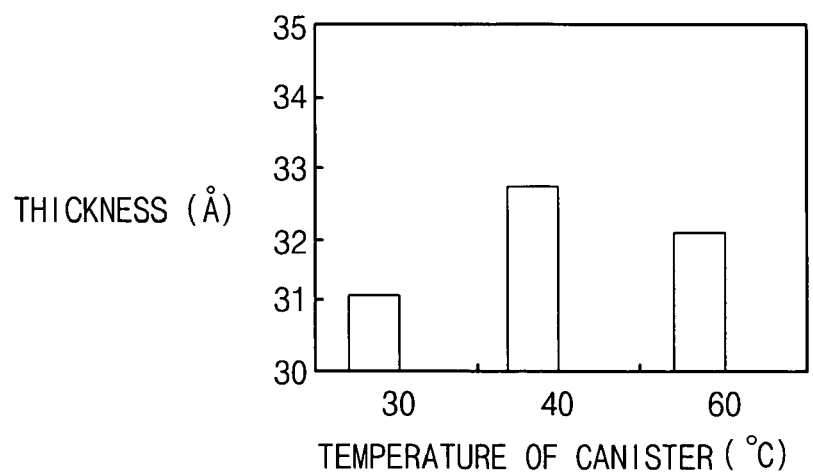
FIG. 10 is a graph illustrating thickness of thin films relative to temperatures of canisters in accordance with an example embodiment of the present invention.

FIG. 10 is a graph illustrating thickness of thin films relative to a temperature of canister in accordance with example embodiments of the present invention. In FIG. 10, the thin films were formed using a Ti(OtBu)$_3$Me metal precursor by an ALD process.

The thin films were formed under deposition conditions except for the temperature of a canister as shown in Table 1.

TABLE 1

| | Deposition Conditions | | | |
|---|---|---|---|---|
| Metal Precursor | Oxidizing Agent | Temperature of Chamber | Carrier Gas | Number of Deposition Cycles |
| Ti(OtBu)$_3$Me | O$_3$ | 160° C. | 1,000 sccm of N$_2$ | 33 |

Referring to FIG. 10 and Table 1, the ALD process was performed under the deposition conditions by varying the temperature of the canisters. When a temperature of the canister was about 30° C., a thickness of the thin film was about 31 Å. The thickness of the thin film was about 33 Å when the temperature of the canister was about 40° C. When the temperature of the canister was about 60° C., the thickness of the thin film was about 32 Å. Thus, the thin film had substantially the greatest thickness when the temperature of the canister was about 40° C.

Figure 11:
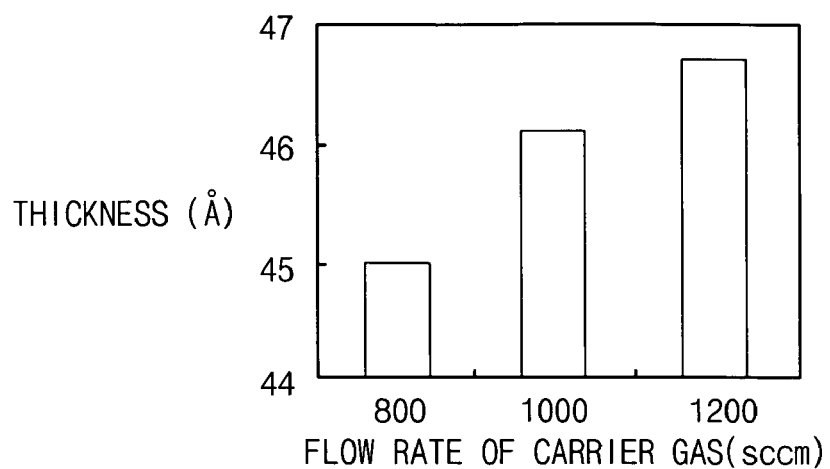
FIG. 11 is a graph illustrating thickness of thin films relative to a flow rate of a carrier gas in accordance with an example embodiment of the present invention.

FIG. 11 is a graph illustrating the thickness of thin films relative to a flow rate of a carrier gas in accordance with example embodiments of the present invention. In FIG. 11, the thin films were formed using a Ti(OtBu)$_3$Me metal precursor by an ALD process.

In the ALD process, the thin films were formed under deposition conditions except for the flow rate of the carrier gas as shown in Table 2.

TABLE 2

| | Deposition Conditions | | | |
|---|---|---|---|---|
| Metal Precursor | Oxidizing Agent | Temperature of Chamber | Temperature of Canister | Number of Deposition Cycles |
| Ti(OtBu)$_3$Me | O$_3$ | 160° C. | 40° C. | 51 |

Referring to FIG. 11 and Table 2, the ALD process was carried out under the deposition conditions by varying the flow rate of the carrier gas. When the flow rate of the carrier gas was increased, the thickness of the thin film was also thickened.

Figure 12:
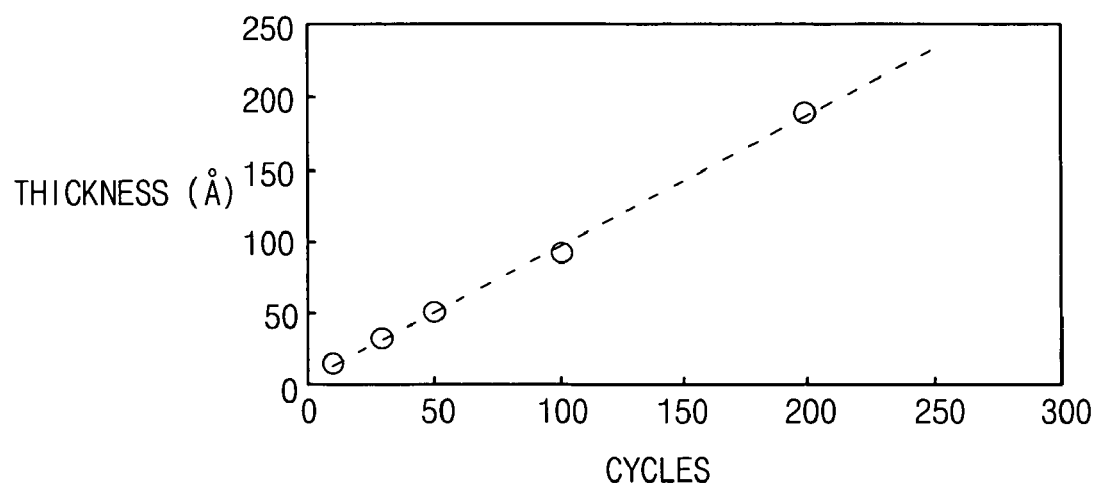
FIG. 12 is a graph illustrating thickness of thin films relative to the numbers of deposition cycles in accordance with an example embodiment of the present invention.

FIG. 12 is a graph illustrating thickness of thin films relative to the numbers of deposition cycles in accordance with example embodiments of the present invention. In FIG. 12, the thin films were formed using a Ti(OtBu)$_3$Me metal precursor by an ALD process.

In the ALD process for forming the thin films, the temperature of the chamber was about 300° C. and the temperature of a canister was about 30° C. The flow rate of a carrier gas was about 1,000 sccm.

Referring to FIG. 12, the thickness of the thin film was linearly increased in proportion to the numbers of the deposition cycles. The deposition rate of the thin film was about 0.9 Å/cycle.

Measurement of Step Coverage of a Thin Film

To measure the step coverage of a thin film in accordance with an example embodiment of the present invention, the thin film was formed on a structure having a hole. The hole of the structure had an aspect ratio of about 10:1.

The thin film was formed under deposition conditions as shown in Table 3, and then the step coverage of the thin film was measured. The step coverage of the thin film means a thickness ratio between a portion of the thin film formed on an upper face of the structure and a portion of the thin film formed on a bottom face of the hole of the structure.

TABLE 3

| | Deposition Conditions | | | | |
|---|---|---|---|---|---|
| Metal Precursor | Oxidizing Agent | Temperature of Chamber | Temperature of Canister | Number of Cycles | Step Coverage |
| Ti(OtBu)$_3$Me | O$_3$ | 300° C. | 30° C. | 200 | 97-100% |

As shown in Table 3, the thin film such as a titanium oxide film had high step coverage of about 97 to about 100 percent. Thus, this thin film is desirable for use as a dielectric layer of a capacitor having a three-dimensional structure such as a cylindrical structure.

Measurement of Leakage Current from a Capacitor Including a Thin Film

Figure 13:
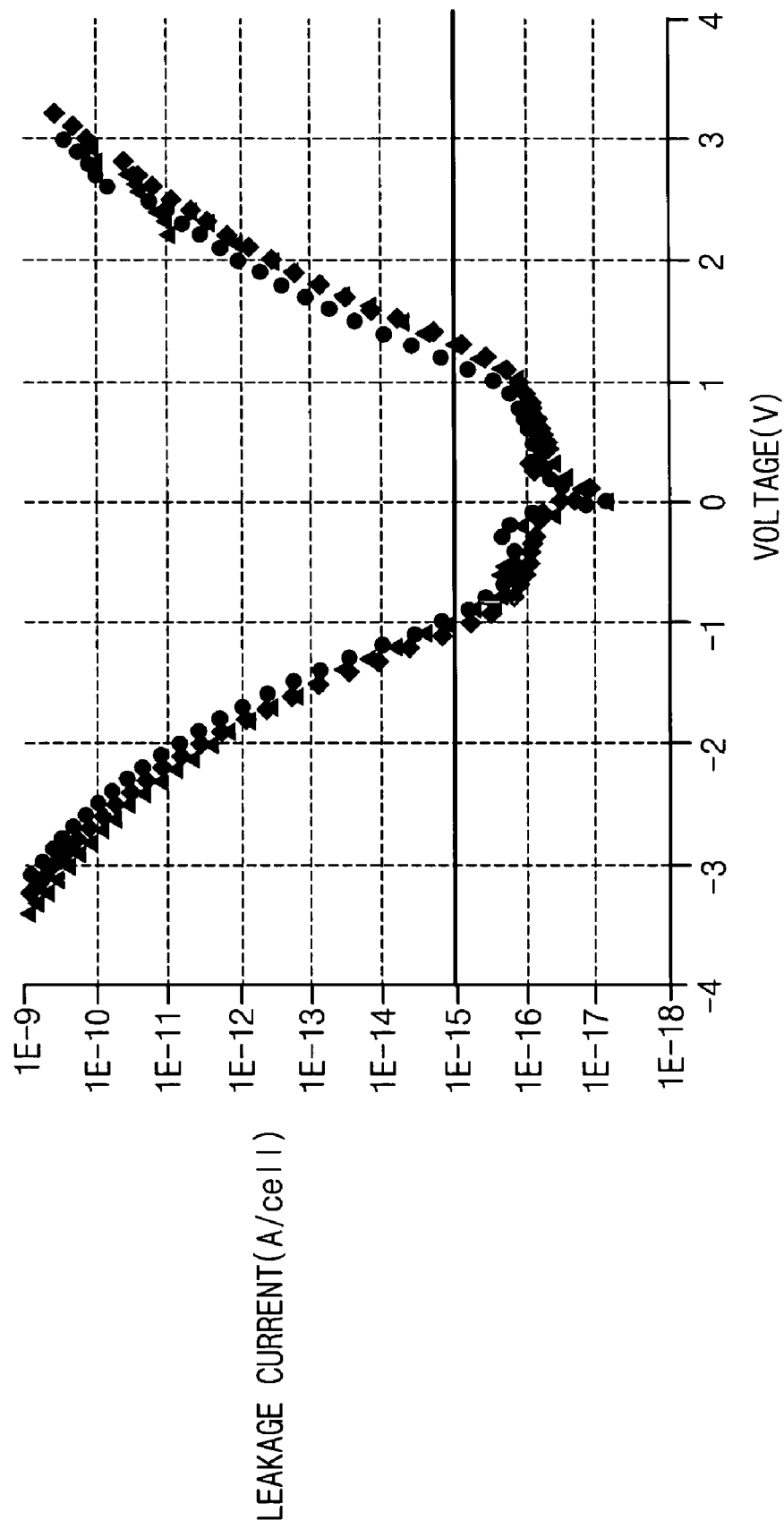
FIG. 13 is a graph illustrating a leakage current of a thin film formed by an ALD process in accordance with an example embodiment of the present invention.

FIG. 13 is a graph illustrating a leakage current of a thin film formed by an ALD process in accordance with an example embodiment of the present invention.

The thin film of titanium oxide was formed under deposition conditions as shown in Table 4.

TABLE 4

| | Deposition Conditions | | | | |
|---|---|---|---|---|---|
| Metal Precursor | Oxidizing Agent | Temperature of Chamber | Temperature of Canister | Carrier gas | Number of Cycles |
| Ti(OtBu)$_3$Me | O$_3$ | 300° C. | 30° C. | 1,000 sccm of N$_2$ | 21 |

The thin film of titanium oxide was employed as a dielectric layer of the capacitor in a semiconductor device having a critical dimension of about 90 nm.

Referring to FIG. 13, the capacitor including the thin film of titanium oxide had a leakage current of less than about $5.00 \times 10^{-15}$ A/cell when an applied voltage was below about 1.0V. Thus, the capacitor including the thin film of the titanium oxide of the example embodiments of the present invention has improved electrical characteristics such as a significantly reduced leakage current in comparison to conventional capacitors.

According to the example embodiments of the present invention, an organometallic compound used as a metal precursor in an ALD process is thermally and chemically stable and also not sensitive to moisture. Additionally, the organometallic compound is in a liquid phase at room temperature and has a high reactivity relative to reactants for forming a thin film. When the ALD process for forming the thin film is performed using an organometallic compound such as Ti(OtBu)$_3$Me as a metal precursor, the thin film has improved characteristics such as good step coverage, low leakage current and a high dielectric constant. Moreover, when the thin film of the example embodiments of the present invention is used as a gate insulation layer of a gate structure or a dielectric layer of a capacitor, the electrical characteristics of the gate structure or the capacitor are improved in comparison to conventional gate structures or capacitors.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming a thin film comprising:
   introducing an organometallic compound represented by the following formula onto a substrate;

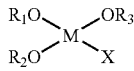

wherein M represents a Group 4A metal, R$_1$, R$_2$ and R$_3$ independently represent hydrogen or an alkyl group having a carbon number from 1 to 5, and X represents hydrogen or an alkyl group having a carbon number from 1 to 5;
   chemisorbing a portion of the organometallic compound on the substrate;
   removing a non-chemisorbed portion of the organometallic compound from the substrate;
   providing an oxidizing agent onto the substrate; and
   forming the thin film including a metal oxide on the substrate by chemically reacting the oxidizing agent with a metal in the organometallic compound and by separating ligands of the organometallic compound.

2. The method of claim 1, wherein the organometallic compound comprises titanium methyl tri-tert-butoxide (Ti(OtBu)$_3$Me).

3. The method of claim 1, wherein forming the thin film is performed at a temperature of about 100° C. to about 350° C.

4. The method of claim 1, wherein the substrate has a temperature of about 30° C. to about 100° C. before introducing the organometallic compound onto the substrate.

5. The method of claim 1, wherein the organometallic compound is introduced onto the substrate with a carrier gas.

6. The method of claim 1, further comprising removing an unreacted portion of the oxidizing agent by a purging process and wherein the ligands are separated from the organometallic compound by a purging process.

7. The method of claim 1, wherein introducing the organometallic compound, chemisorbing the portion of the organometallic compound, removing the unchemisorbed portion of the organometallic compound, providing the oxidizing agent, chemically reacting the oxidizing agent with the metal in the organometallic compound, and separating the ligands of the organometallic compound are repeated at least once.

8. The method of claim 1, wherein the oxidizing agent comprises at least one selected from the group consisting of ozone (O$_3$), water vapor (H$_2$O), hydrogen peroxide (H$_2$O$_2$), methanol (CH$_3$OH) and ethanol (C$_2$H$_5$OH).

9. The method of claim 1, wherein the thin film comprises a gate insulation layer.

10. The method of claim 1, wherein the thin film comprises a dielectric layer.

11. The method of manufacturing a capacitor comprising:
   forming a lower electrode on a substrate;
   forming a dielectric layer including a metal oxide on the lower electrode using an organometallic compound represented by the following formula according to the method of claim 1; and

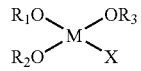

wherein M represents a Group 4A metal selected from the group consisting of titanium, zirconium and hafnium, R$_1$, R$_2$ and R$_3$ independently represent hydrogen or an alkyl group having a carbon number from 1 to 5, and X represents hydrogen or an alkyl group having a carbon number from 1 to 5,
   forming an upper electrode on the dielectric layer.

12. The method of claim 11, wherein forming the dielectric layer comprises:
   introducing the organometallic compound onto the lower electrode;
   chemisorbing a portion of the organometallic compound on the lower electrode;
   removing a non-chemisorbed portion of the organometallic compound from the lower electrode;
   providing an oxidizing agent onto the lower electrode;
   chemically reacting the oxidizing agent with a metal of the organometallic compound;
   separating ligands of the organometallic compound; and
   removing separated ligands and an unreacted oxidizing agent.

13. The method of claim 12, wherein forming the dielectric layer is performed at a temperature of about 100° C. to about 350° C.

14. The method of claim 12, wherein the substrate has a temperature of about 30° C. to about 100° C. before introducing the organometallic compound on the substrate.

15. The method of claim 12, wherein introducing the organometallic compound, chemisorbing the portion of the organometallic compound, removing the non-chemisorbed portion of the organometallic compound, providing the oxidizing agent on the substrate, chemically reacting the oxidizing agent with the metal in the organometallic compound, separating the ligands of the organometallic compound, and removing the separated ligands and the unreacted oxidizing agent are repeated at least once.

16. The method of claim 11, wherein the metal oxide comprises titanium oxide.

17. The method of claim 11, wherein the oraganometallic compound comprises titanium methyl tri-tert-butoxide (Ti(OtBu)$_3$Me).

18. A method of manufacturing a gate structure comprising:
   forming a gate insulation layer including a metal oxide on a substrate using an organometallic compound represented by the following formula according to the method of claim 1;

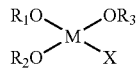

wherein M represents a Group 4A metal selected from the group consisting of titanium, zirconium and hafnium, $R_1$, $R_2$ and $R_3$ independently represent hydrogen or an alkyl group having a carbon number from 1 to 5, and X represents hydrogen or an alkyl group having a carbon number from 1 to 5;
   forming a gate conductive layer on the gate insulation layer; and
   patterning the gate conductive layer and the gate insulation layer to form a gate pattern including a gate conductive layer pattern and a gate insulation layer pattern.

19. The method of claim 18, wherein forming the gate insulation layer comprises:
   introducing the organometallic compound onto the substrate;
   chemisorbing a portion of the organometallic compound on the substrate;
   removing a non-chemisorbed portion of the organometallic compound from the substrate;
   providing an oxidizing agent onto the substrate;
   chemically reacting the oxidizing agent with a metal of the organometallic compound;
   separating ligands of the organometallic compound; and
   removing separated ligands and an unreacted oxidizing agent.

20. The method of claim 19, wherein forming the gate insulation layer is performed at a temperature of about 100° C. to about 350° C.

21. The method of claim 19, wherein the substrate has a temperature of about 30° C. to about 100° C. before introducing the organometallic compound on the substrate.

22. The method of claim 19, wherein introducing the organometallic compound, chemisorbing the portion of the organometallic compound, removing the non-chemisorbed portion of the organometallic compound, providing the oxidizing agent, chemically reacting the oxidizing agent with the metal in the organometallic compound, separating the ligands of the organometallic compound, and removing the separated ligands and the unreacted oxidizing agent are repeated at least once.

23. The method of claim 18, wherein the metal oxide comprises titanium oxide.

24. The method of claim 18, wherein the oraganometallic compound comprises titanium methyl tri-tert-butoxide Ti(OtBu)$_3$Me.

25. The method of claim 1, wherein the Group 4A metal represented by M comprises at least one selected from the group consisting of titanium, zirconium and hafnium.

* * * * *